United States Patent
Potier

[19]

[11] Patent Number: 5,455,541
[45] Date of Patent: Oct. 3, 1995

[54] FREQUENCY SYNTHESIZER HAVING A FREQUENCY GENERATOR WITH N MULTIPLIERS

[75] Inventor: Thierry Potier, Maurepas, France

[73] Assignee: Dassault Electronique, Saint Cloud, France

[21] Appl. No.: 197,617

[22] Filed: Feb. 17, 1994

[30] Foreign Application Priority Data

Feb. 25, 1993 [FR] France .................... 93 02168

[51] Int. Cl.⁶ .................... H03L 7/16; H03L 7/22
[52] U.S. Cl. .................... 331/22; 331/2
[58] Field of Search .................... 331/2, 16, 22, 331/25, 1 R

[56] References Cited

U.S. PATENT DOCUMENTS

| | | | |
|---|---|---|---|
| 3,188,578 | 6/1985 | Winsor | 331/39 |
| 4,673,891 | 6/1987 | Remy | 331/2 |
| 4,763,083 | 8/1988 | Edwards | 331/2 |
| 4,791,387 | 12/1988 | Hasegawa et al. | 331/2 |
| 4,847,569 | 7/1989 | Dudziak et al. | 331/25 |
| 5,128,633 | 7/1992 | Martin et al. | 331/2 |
| 5,332,978 | 7/1994 | Yabuki et al. | 331/2 |

FOREIGN PATENT DOCUMENTS 323077 2/1984 Germany.

*Primary Examiner*—Benny Lee
*Assistant Examiner*—David H. Vu
*Attorney, Agent, or Firm*—Christie, Parker & Hale

[57] ABSTRACT

A frequency synthesizer device which comprises a combination of: an oscillator, a phase comparator, a frequency generator having an input receiving the reference frequency of value OF and N outputs, with N being a whole number between 1 and N, each output being designed to deliver a frequency having a value equal to $2^N FO$, a phase-locked loop consisting of N links connected in series between the output of the oscillator and the first input of the comparator, each link comprising a mixer having a first input connected to one of the outputs of the frequency generator, a second input and an output, the second input of the current mixer being connected to the output of the preceding mixer and the second input of the mixer being connected to the output of the oscillator.

21 Claims, 3 Drawing Sheets

FREQUENCY SYNTHESIZER HAVING A FREQUENCY GENERATOR WITH N MULTIPLIERS

BACKGROUND OF THE INVENTION

This invention concerns frequency synthesis.

It finds general application in electronics and more particularly in space electronics.

In order to effect frequency synthesis over a wide frequency range with a large number of frequency increments, conventional frequency synthesis techniques, particularly those based on the programmable divider, have three disadvantages:

inadequate spectral purity (signal/noise ratio) at the desired output frequency;

presence of non-harmonic stray radiation; and high power consumption, which is particularly inconvenient for space applications.

SUMMARY OF THE INVENTION

It is an object of the invention to remedy the above-mentioned drawbacks.

It is a further object of the invention to provide an improved frequency synthesizer device.

According to the invention, a frequency synthesizer device comprises a combination of:

a frequency-modulated oscillator having an input and an output;

a phase comparator having a first input, a second input receiving a reference frequency and an output connected to the input of the oscillator;

a frequency generator having an input receiving the reference frequency of value FO and N outputs, with N being a whole number between 1 and N, each output of the frequency generator being designed to deliver a frequency having a value equal to $2^N FO$; and a phase-locked loop consisting of N links connected in series between the output of the oscillator and the first input of the comparator, each link comprising a mixer having a first input connected to one of the outputs of the frequency generator, a second input and an output, the second input of the current mixer being connected to the output of the preceding mixer or to the output of the oscillator.

Such a device has the advantage of providing a satisfactory spectral purity at the desired output frequency, insofar as the elements comprising it contribute little degradation due to phase jitter.

Advantageously, the frequency generator comprises N modules connected in series between the input and one output of the frequency generator, each module containing one input connected to the reference frequency of value FO, or to the output of the preceding module and an output designed to deliver a frequency equal to $2^N FO$.

In practice, in order to ensure low degradation due to synthesizer phase jitter, each module is a frequency-doubler circuit possessing a good signal/noise ratio.

According to one aspect of the invention, at least one second input of one mixer is of fixed parity, which enables the frequency of the oscillator to be converted to a predetermined frequency range.

Furthermore, at least one second input of one mixer is of variable parity, which enables the frequency of the oscillator to be varied within a predetermined frequency range.

In practice, in order to place the synthesizer within a given frequency range, it contains in addition a frequency converter having a first input receiving a presetting voltage, in particular derived from a single digital word, converted into voltage by means of a digital/analogue converter, a second input connected to filtering means of the phase-locked loop and an output connected to the input of the oscillator.

Advantageously, a frequency-locked loop is provided for the oscillator, comprising a divider having an input connected to the output of the oscillator, an output, a counter having an input connected to the output of the divider and an output connected to the first input of the frequency converter via the digital/analogue converter.

According to another aspect of the invention, in order to obtain more precise frequency synthesis, the synthesizer is combined with an additional frequency synthesis stage comprising:

an additional frequency-modulated oscillator having an input and an output;

an additional phase-locked loop containing an additional mixer having a first input receiving a predetermined frequency originating from the frequency generator, a second input connected to the output of the additional oscillator and an output, a programmable divider having an input connected to the output of the additional mixer, and an output; and an additional phase comparator having a first input connected to the output of the programmable divider, a second input receiving an additional reference frequency and an output connected to the input of the additional oscillator.

Preferably, it also contains a frequency adder stage comprising:

a frequency-modulated oscillator having an input and an output;

a summing phase-locked loop containing a summing mixer having a first input connected to the output of the oscillator, a second input connected to the output of the summing oscillator; and a summing phase comparator having a first input connected to the output of the summing mixer, a second input connected to the output of the additional oscillator and an output connected to the input of the summing oscillator.

According to a particular application of the invention, the reference frequency FO is of the order of 37.5 MHz, the frequency range of the oscillator is of the order of 1237.5 to 2362.5 MHz with 16×75 MHz increments, the frequency range of the additional oscillator is of the order of 375 MHz to 445 MHz with 15×5 MHz increments and the frequency range of the summing oscillator is of the order of 1612.5 MHz to 2807.5 MHz with 240×5 MHz increments.

Other preferred features and advantages of the invention will become apparent from the detailed description below, and the attached drawings.

DETAILED DESCRIPTION OF THE PREFERRED EMBODIMENT

Figure 1:
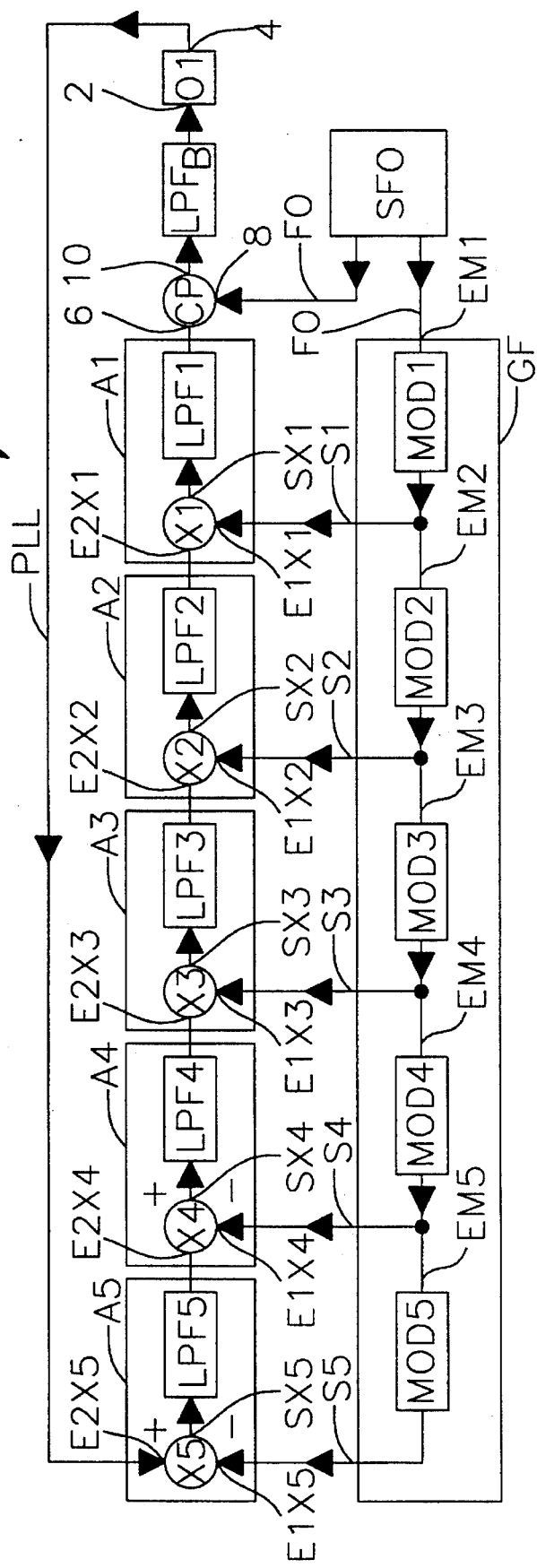
FIG. 1 is a schematic representation of the frequency synthesizer according to the invention.

In FIG. 1, the frequency synthesizer according to the invention is referred to as SYN.

It is arranged around a frequency-modulated oscillator O1 having an input 2 and an output 4.

A phase comparator CP is provided with a first input 6, a second input 8 receiving a reference frequency FO and an output 10 connected to the input 2 of the oscillator O1.

The reference frequency FO is derived from a frequency source SFO.

According to the invention, there is a frequency generator GF having an input EM1 receiving the reference frequency FO and having N outputs S1 to SN, where N is a whole number between 1 and N.

In the synthesizer SYN described with reference to FIG. 1, the whole number is equal to 5.

Of course this number is a non-limiting example.

Each output S1 to S5 of the frequency generator is designed to deliver a frequency having a value equal to $2^N$FO.

Thus, output S1 delivers a frequency equal to 2FO, output S2 delivers a frequency equal to 4FO, output S3 delivers a frequency equal to 8FO, output S4 delivers a frequency equal to 16FO and finally, output S5 delivers a frequency equal to 32FO.

Finally, the synthesizer contains a phase-locked loop PLL comprising five individual modules A1 to A5 connected in series between the output 4 of the oscillator OCT1 and the first input 6 of the comparator CP.

Each link A1 to A5 comprises an individual mixer XG1 to XG5 having a first input E1X1 to E1X5 connected to one of the outputs S1 to S5 of the frequency generator GF, a second input E2X1 to E2X5 and an output SX1 to SX5. The second input E2X1 to E2X5 of the current mixer X1 to X5 is connected to the output SX2 to SX4 of the preceding mixer XG2 to XG4 or to the output 4 of the oscillator OCT1.

Advantageously, the frequency generator GF contains five modules MOD1 to MOD5 connected in series between the input EM1 and the output S5 of the frequency generator GF.

Each module MOD1 to MOD5 contains an individual input EM1 to EM5 connected to the reference frequency FO or to the output S1 to S4 of the preceding module MOD1 to MOD4, and an output S1 to S5 designed to deliver a frequency equal to $2^N$FO.

In practice, in order to ensure low degradation due to synthesizer phase jitter, each module MOD1 to MOD5 is a frequency-doubler circuit.

For example, the frequency-doubler circuit is based on full-wave rectification.

The expert knows that such circuits offer a good signal/noise ratio and low power consumption.

Advantageously, each link A1 to A5 additionally contains filtering means LPF1 to LPF5 placed at the output of the mixer XG1 to XG5 associated with the said link A1 to A5.

In practice, the filtering means F1 to F5 are of the low-pass filter type.

Filtering means LPFB of the phase-locked loop PLL are provided to be an advantage between the output 10 of the phase comparator CP and the input 2 of the oscillator O1.

In practice the filtering means LPFB of the phase-locked loop are of the low-pass filter type with high cut-off frequency.

According to the invention, the synthesizer SYN takes advantage of the facility for selecting the + or − parities of the inputs of the mixers X1 to XN of the phase-locked loop PLL.

Thus, to provide conversion of the frequency of the oscillator O1 to a predetermined frequency range, the second inputs E2X4 and E2X5 of the mixers X4 and X5 are of fixed parity, in this case positive.

Moreover, the second inputs E2X1, E2X2 and E2X3 of the mixers X1, X2 and X3 are of variable parity, i.e., positive or negative, to provide variation of the frequency of the oscillator O1 within a predetermined frequency range.

Consequently, when the phase-locked loop PLL is locked, the frequency of the oscillator O1 corresponds to one of the following possible values:

+/−FO +/−2FO +/−4FO +/−8FO +16FO +32 FO.

Figure 2:
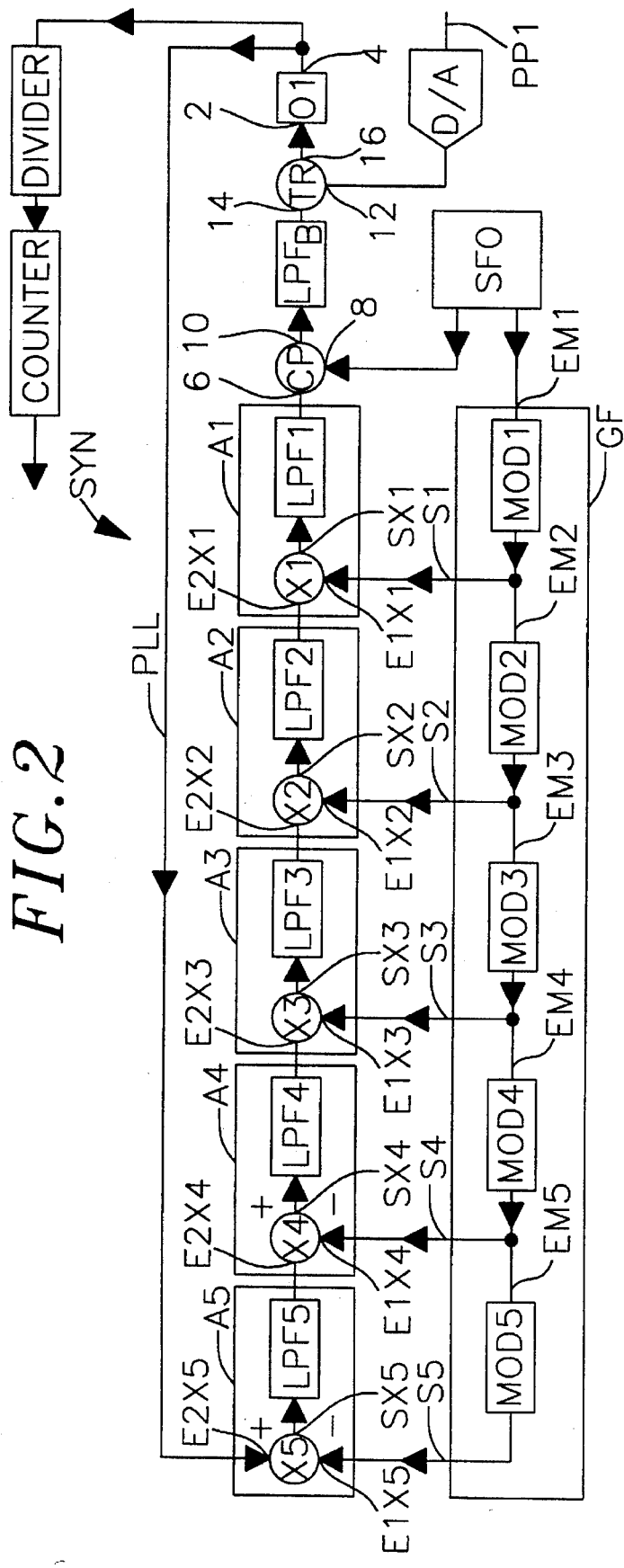
FIG. 2 is a schematic representation of the frequency synthesizer in FIG. 1, equipped with a frequency converter according to the invention.

According to FIG. 2, in order to select a desired frequency range, the synthesizer SYN contains in addition a frequency converter TR having a first input 12 receiving a presetting voltage PP1 derived from a single digital word, converted into voltage by means of a digital/analogue converter D/A, a second input 14 connected to filtering means LPFB of the phase-locked loop PLL and an output 16 connected to the input 2 of the oscillator O1.

Advantageously, the presetting (voltage) PP1 is checked by means of a divider having an input connected to the output 4 of the oscillator O1 and an output, a counter COMP having an input connected to the output of the divider DIV and an output connected to the first input 12 of the frequency converter TR via an arithmetic and logic unit (not shown) and the digital/analogue converter D/A.

The divider is a divide-by-128 divider, for example.

Since the phase jitter degradations due to the frequency generator are negligible, the performance of the synthesizer depends in this case on the high value of the cut-off frequency of the phase-locked loop of the synthesizer.

Where the single reference frequency FO is of the order of 37.5 MHz, a value of the order of 1 MHz for the cut-off frequency provides a better reduction in the phase jitter of the oscillator O1 and is compatible with the high beat frequency of the phase comparator CP which receives the reference frequency FO via its other path 8.

In a particular application, for example a space application, it is an aim of the invention to propose a wide frequency range with a large number of frequency increments.

In order to obtain such a wide frequency range it is advantageous to connect or combine the synthesizer, as described with reference to FIGS. 1 or 2, to or with an additional frequency synthesis stage and an adder stage.

Figure 3:
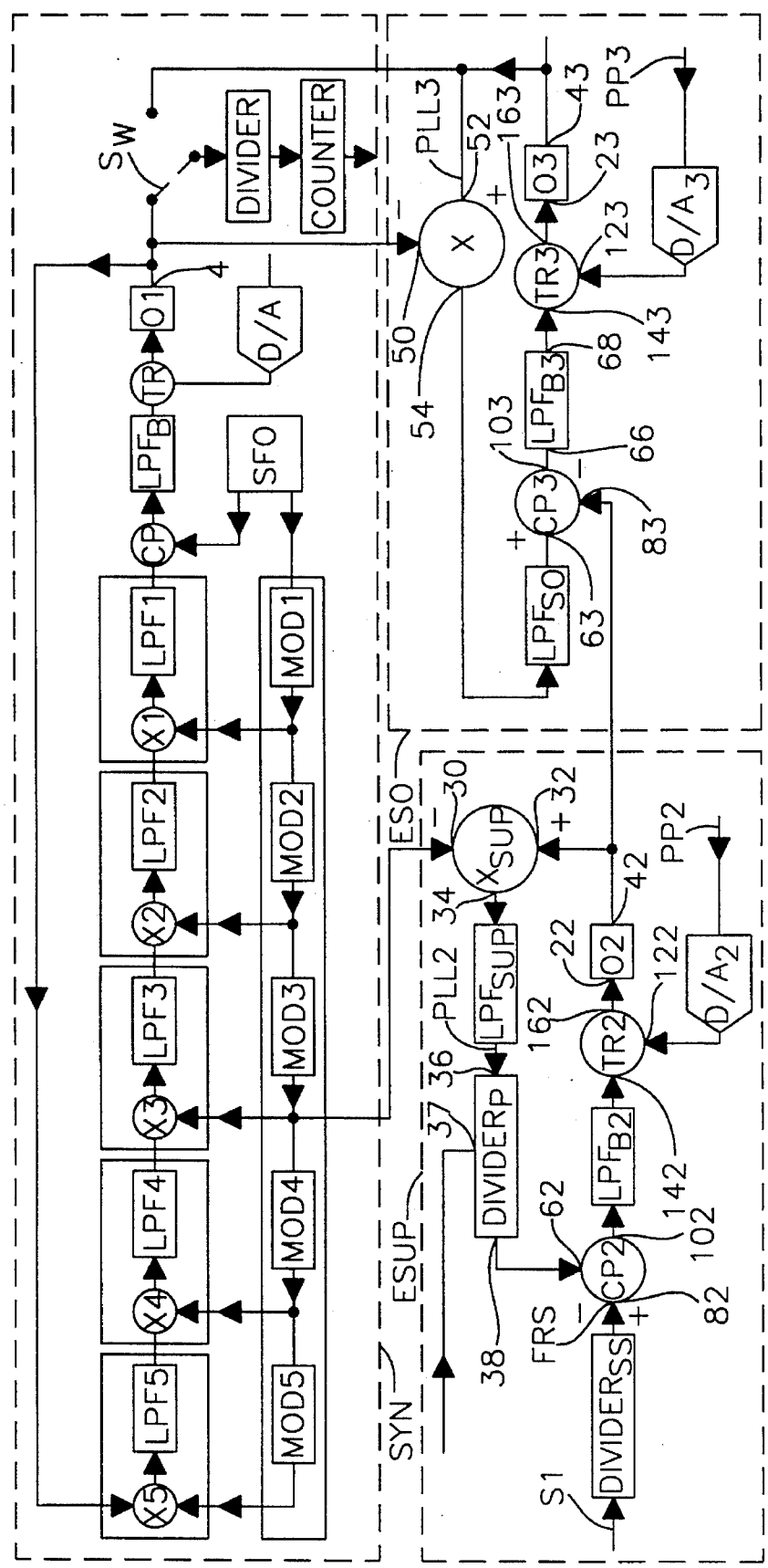
FIG. 3 is a schematic representation of the frequency synthesizer of FIG. 2, combined with an additional frequency synthesis stage and an adder stage according to the invention.

Such a combination is shown in FIG. 3.

The additional frequency synthesis stage ESUP is arranged around an additional frequency-modulated oscillator O2 having an input 22 and an output 42.

An additional phase-locked loop PLL2 is provided with the said additional frequency-modulated oscillator O2.

The phase-locked loop PLL2 contains an additional mixer XSUP having a first input 30 receiving a predetermined frequency derived from the frequency generator GF, in this case 300 MHz, a second input 32 connected to the output 42 of the additional oscillator, and an output 34. The phase-locked loop is completed by a programmable divider DIVIDER$_P$ having an input 36 connected to the output 34 of the additional mixer X$_{SUP}$, and an output 38.

The programmable divider DIVIDER$_P$ is of the conventional type. At one input 37 it receives a 4-bit digital word designed, for example, to programme the increments of the programmable divider.

For example the programmable divider DIVIDER$_P$ has an increment varying between 15 and 29.

Low-pass type of filtering means LPF$_{SUP}$ are interposed between the mixer X$_{SUP}$ of the additional stage and the programmable divider DIVIDER$_P$.

The additional frequency synthesis stage contains an additional phase comparator CP2 having a first input 62 connected to the output 38 of the programmable divider DIVIDER$_P$, a second input 82 receiving an additional reference frequency FRS and an output 102 connected to the input 32 of the additional oscillator O2.

Advantageously, the additional reference frequency FRS is derived from the frequency generator GF, for example from the output S1 via an additional divider DIVIDER$_{SS}$ designed to divide the frequency from S1 by 15.

Additional filtering means LPF$_{B2}$ of the additional phase-locked loop PLL2 are provided between the output 102 of the additional phase comparator CP2 and the input 22 of the additional oscillator OCT2.

As seen above, it is also useful to equip the additional frequency synthesis stage with an additional frequency converter TR2.

The latter has a first input 122 receiving a presetting voltage PP2 derived from an additional single digital word, converted into voltage by means of an additional digital/analogue converter D/A$_2$, a second input 142 connected to additional filtering means LPF2 of the additional phase-locked loop PLL2 and an output 162 connected to the input 22 of the additional oscillator OCT2.

For example the frequency range of the additional oscillator O2 is of the order of 375 MHz to 445 MHz, with 15×5 MHz increments.

The lower frequency of the additional oscillator O2 and its relatively small frequency swing causes little phase jitter and consequently permits a low cut-off frequency for the additional phase-locked loop.

For example, the cut-off frequency is of the order of 20 kHz, matched to the high beat (frequency) of the comparator CP2 which in this case is equal to 10 MHz.

As seen above, the acquisition of the additional synthesis stage ESUP is assisted by means of a presetting signal of PP2, converted into voltage by an additional converter D/A$_2$ and by additional sweeping (not shown).

Finally, a frequency adder stage is additionally provided to sum the frequencies originating from the synthesizer SYN and from the additional frequency stage ESUP described above.

The frequency adder stage ESO is arranged around a summing frequency-modulated oscillator O3 having an input 23 and an output 43.

The adder stage contains a summing phase-locked loop PLL3 containing a summing mixer XX having a first input 50 connected to the output 4 of the oscillator O1, a second input 52 connected to the output 43 of the summing oscillator O3, and an output 54.

A summing phase comparator CP3 completes the adder stage.

The summing phase comparator CP3 has a first input 63 connected to the output 54 of the summing mixer X, a second input 83 connected to the output 42 of the additional oscillator O2 and an output 103 connected to the input 23 of the summing oscillator O3.

Advantageously, summing filtering means LPF$_{B3}$ of the summing phase-locked loop PLL3 and a summing frequency converter TR3 are provided between the output 103 of the summing phase comparator CP3 and the input 23 of the summing oscillator O3.

As with the presetting of the oscillators O1 and O2, the summing frequency converter TR3 is provided. This converter TR3 has a first input 123 receiving a presetting voltage PP3 derived from a single digital summing word, converted into voltage by means of a summing digital/analogue converter D/A$_3$, a second input 143 connected by means of summing filtering means LPF$_{B3}$ and an output 163 connected to the input 23 of the summing oscillator O3.

As with the presetting of the oscillator O1, the oscillator O3 is advantageously controlled by the chain comprising divider DIVIDER and counter COUNTER described with reference to FIG. 1.

Advantageously, a changeover switch SW is able to switch the frequency-locked loop of the oscillator O1 to the summing oscillator O3 in response to a predetermined command.

In practice, filtering means LPF$_{SO}$ of the low-pass type are interposed between the mixer X and the phase comparator CP3.

According to the above-mentioned frequency values, the frequency range of the summing oscillator O3 is made to be of the order of 1612.5 MHz to 2807.5 MHz, with 240×5 MHz increments.

The expert will understand that excellent spectral purity performance is obtained over a wide frequency range with such a frequency synthesizer.

I claim:

1. A frequency synthesizer device comprising:

a frequency-modulated oscillator having an input and an output;

a phase comparator having a first input, a second input receiving a reference frequency of value FO, and an output connected to the input of the oscillator;

a frequency generator having an input receiving the reference frequency of value FO, and N outputs, with N being a whole number between 1 and N, the frequency generator comprising N multipliers each for outputting a frequency having a value equal to $2^N FO$, wherein n is a whole number between 1 and N;

a phase-locked loop having N links connected in series between the output of the oscillator and the first input of the comparator, each link comprising a mixer having a first input connected to one of the outputs of the frequency generator, a second input and an output, the second input of each mixer after the first link in the series being connected to the output of the preceding mixer, and the second input of the mixer of the first link being connected to the output of the oscillator.

2. The device of claim 1 wherein the N multipliers are connected in series between the input and one output of the frequency generator, the first multiplier in the series containing one input connected to the reference frequency of value FO, each successive module containing one input connected to the output of the preceding multiplier and each multiplier further containing one output designed to deliver a frequency equal to $2^N FO$ where n is the number of the multiplier in the series.

3. The device of claim 2 wherein each multiplier is a frequency-doubler circuit.

4. The device of claim 1 wherein each link additionally contains filtering means placed at the output of the mixer associated with the link.

5. The device of claim 4 wherein the filtering means each comprise low-pass filter.

6. The device of claim 1 wherein filtering means is provided in the phase-locked loop between the output of the phase comparator and the input of the oscillator.

7. The device of claim 1 wherein at least one second input of one mixer is of fixed parity, whereby the frequency of the oscillator can be converted to a predetermined frequency range.

8. The device of claim 1 wherein at least one second input of one mixer is of variable parity, whereby the frequency of the oscillator can be varied within a predetermined frequency range.

9. The device of claim 6 further comprising a frequency converter having a first input receiving a presetting voltage which is derived from a single digital word, converted into voltage by means of a digital/analogue converter, a second input connected to the filtering means of the phase-locked loop and an output connected to the input of the oscillator.

10. The device of claim 9 further comprising a frequency-locked loop for the oscillator including a divider having an input and an output, wherein the input is connected to the output of the oscillator, and a counter having an input connected to the output of the divider, and an output connected to the first input of the frequency converter via an arithmetic and logic unit and the digital/analogue converter.

11. The device of claim 1 further comprising a frequency synthesis stage including:

an additional frequency-modulated oscillator having an input and an output, an additional phase-locked loop containing an additional mixer having a first input receiving a predetermined frequency originating from the frequency generator, a second input connected to the output of the additional oscillator, and an output, a programmable divider having an input connected to the output of the additional mixer, and an output, and an additional phase comparator having a first input connected to the output of the programmable divider, a second input receiving an additional reference frequency and an output connected to the input of the additional oscillator.

12. The device of claim 11 wherein additional filtering means of the additional phase-locked loop are provided between the output of the additional phase comparator and the input of the additional oscillator.

13. The device of claim 12 further comprising an additional frequency converter having a first input receiving a presetting voltage derived from an additional single digital word, converted into voltage by means of an additional digital/analogue converter, a second input connected to additional filtering means of the additional phase-locked loop and an output connected to the input of the additional oscillator.

14. The device of claim 11 further comprising a frequency adder stage including:

a summing frequency modulated oscillator having an input and an output, a summing phase-locked loop containing a summing mixer having a first input connected to the output of the oscillator, a second input connected to the output of the summing oscillator, and an output, and a summing phase comparator having a first input connected to the output of the summing mixer via auxiliary filtering means, a second input connected to the output of the additional oscillator and an output connected to the input of the summing oscillator.

15. The device of claim 14 wherein summing filtering means of the summing phase-locked loop are provided between the output of the summing phase comparator and the input of the summing oscillator.

16. The device of claim 15 further comprising a summing frequency converter having a first input receiving a presetting voltage derived in particular from a single digital summing word, converted into voltage by means of a summing digital/analogue converter, a second input connected by means of summing filtering means of the summing phase-locked loop, and an output connected to the input of the summing oscillator.

17. The device of claim 16 further comprising a frequency-locked loop for the summing oscillator, including a divider having an input connected to the output of the summing oscillator, an output, and a counter having an input connected to the output of the divider and an output connected to the first input of the summing frequency converter via an arithmetic and logic unit and the summing digital/analogue converter.

18. The device of claim 1 wherein the reference frequency FO is of the order of 37.5 MHz.

19. The device of claim 18 wherein the frequency range of the oscillator is of the order of 1237.5 MHz to 2362.5 MHz with 16×75 MHz increments.

20. The device of claim 11 wherein the reference frequency is of the order of 37.5 MHz and the frequency range of the additional oscillator is of the order of 375 MHz to 445 MHz with 15×5 MHz increments.

21. The device of claims 14 wherein the reference frequency FO is of the order of 37.5 MHz and the frequency range of the summing oscillator is of the order of 1612.5 MHz to 2807.5 MHz with 240×5 MHz increments.

* * * * *

UNITED STATES PATENT AND TRADEMARK OFFICE
CERTIFICATE OF CORRECTION

PATENT NO.   : 5,455,541
DATED        : October 3, 1995
INVENTOR(S)  : Thierry Potier It is certified that error appears in the above-indentified patent and that said Letters Patent is hereby corrected as shown below:

```
ABSTRACT, line 4, replace "OF" with -- FO --.
Column 1, line 41, change "2^N FO" to -- 2^n FO --.
Column 1, line 59, change "2^N FO" to -- 2^n FO --.
Column 2, line 12, before "a counter" insert -- and --.
Column 3, lines 38,39, change "XG1 to XG5" to
           -- X1 to X5 --.
Column 3, line 44, replace "XG2 to XG4" with
           -- X2 to X4 --.
Column 3, line 52, change "2^N FO" to -- 2^n FO --.
Column 3, line 64, change "XG1 to XG5" to
           -- X1 to X5 --.
Column 6, line 46, replace "2^N FO" with -- 2^n FO --.
Column 6, line 61, change "module" to -- multiplier --.
Column 6, line 64, change "2^N FO" to -- 2^n FO --.
Column 8, line 48, change "claims 14" to
           -- claim 14 --.
```

Signed and Sealed this

Twenty-fifth Day of June, 1996

Attest:

BRUCE LEHMAN

*Attesting Officer*          Commissioner of Patents and Trademarks